US006639367B2

(12) United States Patent
Wells et al.

(10) Patent No.: US 6,639,367 B2
(45) Date of Patent: Oct. 28, 2003

(54) CONTROL CIRCUIT EMPLOYING PRECONDITIONED FEEDBACK AMPLIFIER FOR INITIALIZING VCO OPERATING FREQUENCY

(75) Inventors: James Edward Wells, Merrimack, NJ (US); Vishal Gupta, Manchester, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/174,089

(22) Filed: Jun. 18, 2002

(65) Prior Publication Data

US 2003/0160572 A1 Aug. 28, 2003

Related U.S. Application Data

(60) Provisional application No. 60/359,849, filed on Feb. 27, 2002.

(51) Int. Cl.[7] .......................... H05B 37/02; H01L 41/04

(52) U.S. Cl. ................. 315/224; 315/291; 315/209 PZ; 315/307; 310/318; 310/311; 310/314

(58) Field of Search ................................ 315/224, 291, 315/307, 276, 274, 209 PZ, DIG. 5; 310/318, 311, 314, 316, 317, 319

(56) References Cited

U.S. PATENT DOCUMENTS

| | | | | |
|---|---|---|---|---|
| 4,604,552 A | | 8/1986 | Alley | 315/176 |
| 5,548,189 A | | 8/1996 | Williams | 315/224 |
| 5,675,484 A | | 10/1997 | Shimada | 363/71 |
| 5,726,536 A | | 3/1998 | Hagiwara | 315/276 |
| 5,731,652 A | | 3/1998 | Shimada | 310/316 |
| 5,768,111 A | | 6/1998 | Zaitsu | 363/15 |
| 5,796,213 A | | 8/1998 | Kawaski | 315/209 |
| 5,834,907 A | | 11/1998 | Takehara | 315/307 |
| 5,854,543 A | | 12/1998 | Satoh et al. | 315/307 |
| 5,872,419 A | | 2/1999 | Hall et al. | 310/359 |
| 5,886,477 A | | 3/1999 | Honbo et al. | 315/318 |
| 5,894,184 A | | 4/1999 | Furuhashi et al. | 310/316 |
| 5,910,711 A | | 6/1999 | Porath et al. | 315/291 |
| 5,923,546 A | | 7/1999 | Shimida et al. | 363/40 |
| 6,087,787 A | | 7/2000 | Williams | 315/307 |
| 6,118,221 A | | 9/2000 | Kumasaka et al. | 315/208 PZ |
| 6,198,198 B1 | | 3/2001 | Fujimura et al. | 310/316.01 |
| 6,239,558 B1 | | 5/2001 | Fujimura et al. | 315/307 |
| 6,268,681 B1 | * | 7/2001 | Yamaguchi et al. | 310/316.01 |

OTHER PUBLICATIONS

Unitrode Corporation, "Enhanced BiCMOS Cold Cathode Fluorescent Lamp Driver Controller," Advance Information, Jan. 2000.

Unitrode Corporation, "Enhanced BiCMOS Cold Cathode Fluorescent Lamp Driver Controller," Oct. 1998– Revised Nov. 2000.

Tashiki Inoue et al, "Third Order Longitudinal Mode Piezoelectric Ceramic Transformer for High–Voltage Power Inverter," Jul. 1998, pp. 1128–1135.

Lin et al., "High–Voltage Applications of The Piezoelectric Transformers," Final Report prepared for Moterola Fellowship, Jan. 2, 1997.

* cited by examiner

*Primary Examiner*—Don Wong
*Assistant Examiner*—Tuyet T. Vo
(74) *Attorney, Agent, or Firm*—W. Daniel Swayze, Jr.; W. James Brady; Frederick J. Telecky, Jr.

(57) ABSTRACT

A control circuit for a piezo transformer based power supply includes oscillator circuitry, drive circuitry, sense circuitry, and feedback circuitry collectively operating to regulate an operational parameter of the supply, such as the current supplied to a cold cathode fluorescent lamp (CCFL). The feedback circuitry includes initialization circuitry that establishes an initial value of an oscillator control signal corresponding to an initial operating frequency, and thereafter permits the feedback circuitry to gradually drive the oscillator control signal to a normal operating value such that the operating frequency is swept from the initial operating frequency to a normal operating frequency. When controlling the power supplied to a CCFL, the initial operating frequency is preferably a maximum frequency of the oscillator, and the operating frequency is swept downward so as to pass through the frequency at which the lamp "strikes", or begins conduction, and thereafter into regulation.

20 Claims, 5 Drawing Sheets

CONTROL CIRCUIT EMPLOYING PRECONDITIONED FEEDBACK AMPLIFIER FOR INITIALIZING VCO OPERATING FREQUENCY

CROSS REFERENCE TO RELATED APPLICATIONS

This application claims priority under 35 U.S.C. §119(e) of U.S. Provisional Patent Application No. 60/359,849 filed Feb. 27, 2002, the disclosure of which is hereby incorporated by reference herein.

STATEMENT REGARDING FEDERALLY SPONSORED RESEARCH OR DEVELOPMENT

Not Applicable.

BACKGROUND OF THE INVENTION

The present invention is related to the field of power supply circuits, and more particularly to power supply circuits using piezoelectric transformers to supply power to fluorescent lamps.

Recent advances in ceramics technology have yielded a new generation of so-called "piezoelectric transformers" (also referred to herein as "piezo transformers") that are useful in certain applications. These devices, which are constructed using laminated thin layers of ceramic material, exploit a well-known phenomenon called the "piezoelectric effect" to provide AC voltage gain, in contrast to the magnetic field effects relied upon by conventional wound transformers. Like conventional transformers, piezo transformers are fairly rugged and can be used to obtain voltage gain in high-voltage applications. Additionally, due to their thin profile, piezo transformers can be used in applications where bulkier wire-wound transformers are impractical. For example, piezo transformers are used in power supplies that provide high-voltage power to fluorescent lamps used as backlights in portable computers. Due to their thin profiles, piezo transformers used in such applications do not adversely affect the desired sleekness of the portable computer enclosure.

Piezo transformers operate most efficiently when operated at frequencies at or near a multiple of a fundamental resonant frequency, which is a function of mechanical characteristics of the transformer such as material type, dimensions, etc. However, piezo transformers are high-impedance devices, and therefore their resonance characteristics as well as other characteristics are sensitive to the loading of the transformer output in operational circuits. Resonant frequency, voltage gain at the resonant frequency, and sharpness of the gain-versus-frequency curve all diminish with increased loading.

The diminishing of resonant frequency and gain with an increase in loading are purposely exploited when a piezo transformer is used to drive a fluorescent lamp. The frequency of the signal applied to the primary inputs of the piezo transformer is slowly swept from a frequency higher than the unloaded resonant frequency toward lower frequencies. As the resonant frequency is approached, the gain increases to the point that the transformer output voltage is sufficiently high to "strike", or initiate conduction in, the lamp. Once the lamp begins conducting, it presents a much higher load to the transformer, causing the voltage gain and therefore the output voltage of the transformer to drop considerably. The conduction characteristics of the lamp are such that it continues to conduct current at the reduced voltage, so the circuit then enters a stable, lower-voltage operating condition. The intensity of the lamp is regulated by controlling the frequency of the AC drive supplied to the piezo transformer as a function of the lamp current.

The control circuits for piezo transformer based power supplies are often implemented using integrated circuits, which exhibit certain cost characteristics. For example, it is often desirable from a cost perspective to limit the number of input/output pins of an integrated circuit, and likewise limit the amount of active circuit area of an integrated circuit. However, such limitations may run counter to the need for certain functionality in the system in which the integrated circuit is used, such as the above-described regulation of lamp current by controlling operating frequency and the initial sweeping of the operating frequency to strike the lamp correctly. It would be useful to provide a controller integrated circuit for piezo transformer based power supplies that performs these functions while minimizing integrated circuit area and pin count so as to realize greater cost effectiveness.

BRIEF SUMMARY OF THE INVENTION

In accordance with the present invention, a control circuit for a piezo transformer based power supply is disclosed that controls operating frequency both for startup as well as for steady state regulation in an improved manner.

The control circuit contains oscillator circuitry that establishes an operating frequency as a function of an oscillator control signal, and drive circuitry that generates a switching control signal at the operating frequency for a primary circuit of the piezo transformer. Sense circuitry generates a feedback signal indicative of an operational parameter of the power supply that is sensitive to frequency-dependent gain of the piezo transformer, such as the current in a cold cathode fluorescent lamp powered by the power supply.

Feedback circuitry varies the oscillator control signal in response to the feedback signal in a manner tending to regulate the operational parameter to a predetermined value. The feedback circuitry includes initialization circuitry that operates during an initialization phase to establish an initial value of the oscillator control signal corresponding to an initial operating frequency, and that thereafter permits the feedback circuitry to gradually drive the oscillator control signal to a normal operating value such that the operating frequency is swept from the initial operating frequency to a normal operating frequency. This operation can provide for the correct striking of a lamp, for example, by establishing a maximum operating frequency initially and then sweeping the operating frequency downward to the normal operating frequency, at which point regulation occurs.

In one embodiment, the feedback circuitry includes a feedback error amplifier whose inputs and outputs are connected to switching circuitry that effects the operation in the initialization phase and the normal operating phase. During the initialization phase, the oscillator control signal is connected to a predetermined voltage, and the error amplifier inputs are connected to predetermined voltages to condition the error amplifier output. Thereafter, one error amplifier input is connected to receive the feedback signal, and the error amplifier output is connected to generate the oscillator control signal. Ensuring operation results in the gradual sweeping of the operating frequency from the initial operating frequency to the normal operating frequency.

The initialization circuitry constitutes a small addition to the feedback circuitry that effects the correct initialization of the oscillator frequency. Prior controller circuits have required entirely separate initialization circuitry and integrated circuit package pins, with attendant cost drawbacks.

Other aspects, features, and advantages of the present invention will be apparent from the detailed description that follows.

BRIEF DESCRIPTION OF THE SEVERAL VIEWS OF THE DRAWING

The invention will be more fully understood by reference to the following Detailed Description of the Invention in conjunction with the Drawing, of which.

DETAILED DESCRIPTION OF THE INVENTION

Figure 1:
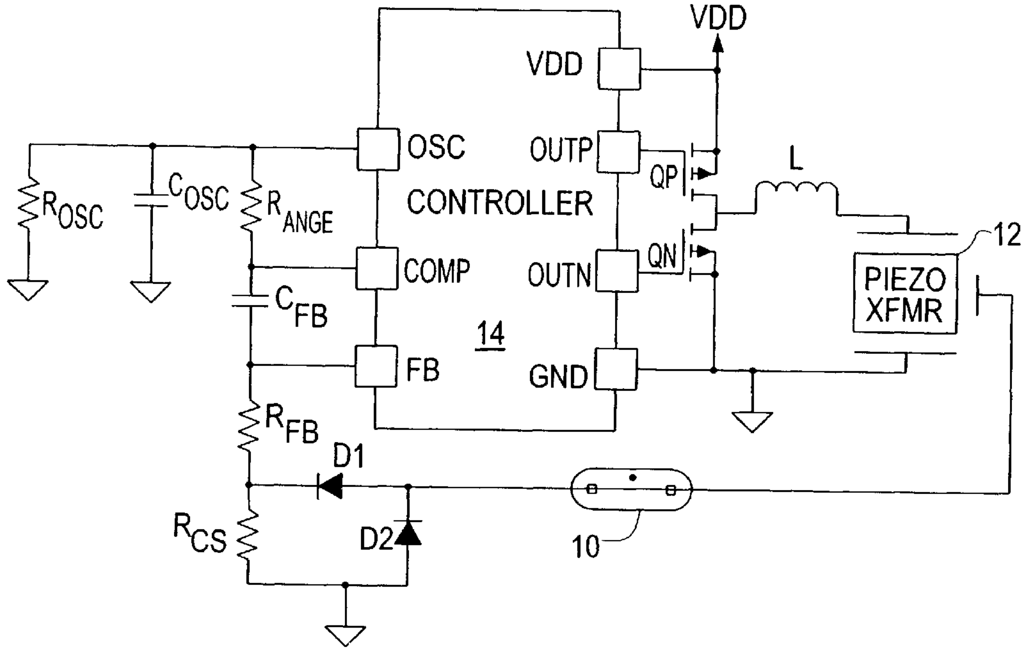
FIG. 1 is a schematic diagram of a power supply for a cold cathode fluorescent lamp employing a control circuit in accordance with the present invention.

In FIG. 1, a cold cathode fluorescent lamp (CCFL) 10 is driven from the secondary side of a piezo transformer 12. The primary side of the piezo transformer 12 receives AC drive from a half-bridge switched resonant circuit including MOS transistors QP and QN and an inductor L. Drive signals OUTP and OUTN for the transistors QP and QN are generated by a controller 14. Current sensing circuitry for the CCFL lamp 10 includes diodes D1 and D2 and resistor RCS. Feedback circuitry includes a feedback resistor RFB and a feedback capacitor CFB. The circuit also includes oscillator programming circuitry including resistors RANGE and ROSC and capacitor COSC.

The circuit of FIG. 1 operates generally as follows. An oscillator (not shown in FIG. 1) within the controller 14 establishes a switching signal whose frequency is within a range over which the piezo transformer 12 supplies substantial gain. This switching signal is used to generate the drive signals for the transistors QP and QN such that they conduct in an alternating fashion. As a result, an AC voltage signal is supplied to the primary of the piezo transformer 12, and this signal is boosted by the piezo transformer 12 to a magnitude sufficient to drive the CCFL 10. The magnitude of the lamp current is sensed as a corresponding feedback voltage that acts through the feedback components RFB and CFB and the oscillator programming components RANGE, ROSC and COSC to control the frequency of the switching signal such that regulation of the lamp current is achieved. As described above, this frequency-based regulation of lamp current exploits the frequency-dependent gain of the piezo transformer 12.

Figure 2:
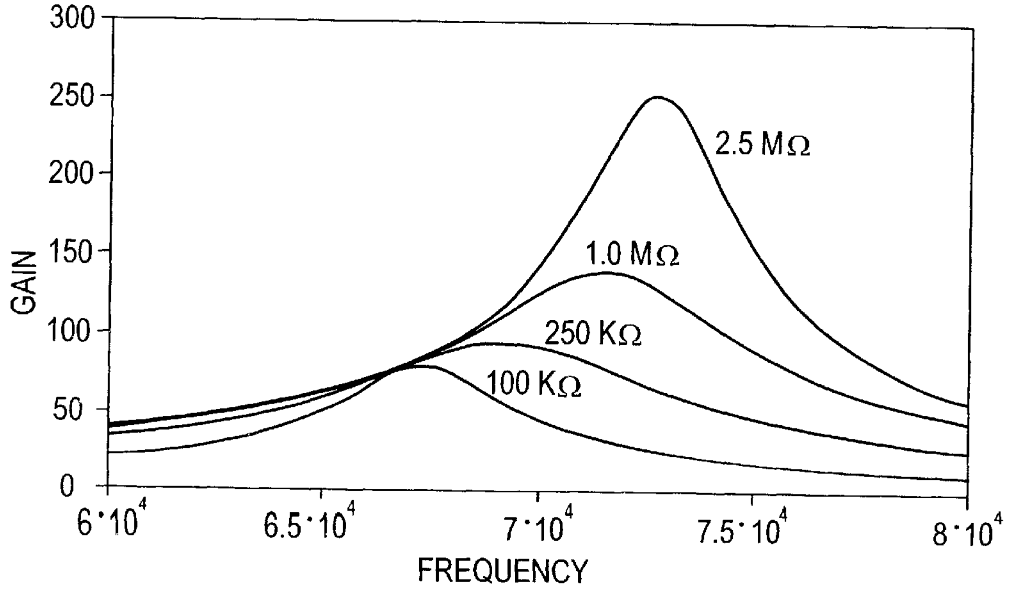
FIG. 2 PRIOR ART
FIG. 2 is plot of gain-versus-frequency characteristics of piezo transformers as known in the art.

FIG. 2 shows a plot of gain versus frequency for a typical piezo transformer 12 at four different output load values. As shown, the resonant frequency diminishes from about 72.5 KHz to about 67 KHz as the value of the load resistance diminishes from 2.5 Mohm to 100 Kohm. Also, the peak and average gain diminish with diminishing load resistance as shown.

Figure 3:
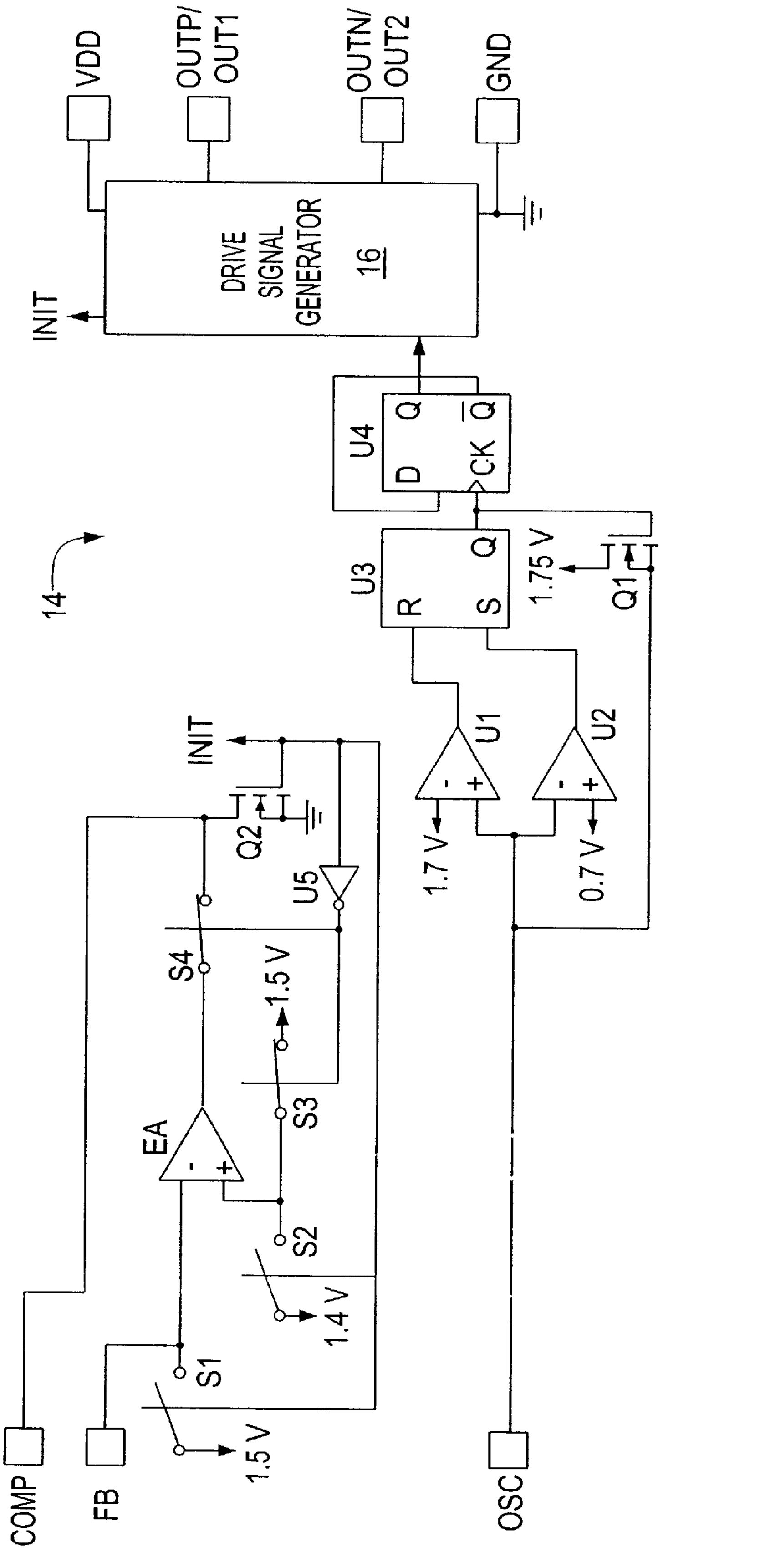
FIG. 3 is a schematic diagram of the control circuit of FIG. 1.

FIG. 3 shows the structure of the controller 14. The oscillator circuitry includes a pair of comparators U1 and U2, an NMOS transistor Q1, a latch U3 and a flip-flop U4. The output of this circuitry is provided to a drive signal generator circuit 16 whose outputs are the drive signals OUTP and OUTN supplied to the transistors QP and QN of FIG. 1 (the alternative labeling OUT1 and OUT2 is used in connection with other embodiments as described below). The controller 14 also includes an error amplifier EA and associated circuitry including switches S1–S4, inverter U5, and an initialization pull-down transistor Q2.

Figure 4:
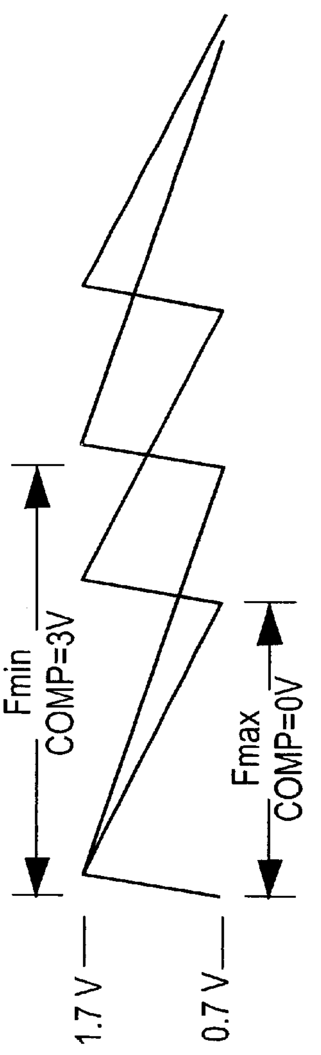
FIGS. 4 and 5 are diagrams of waveforms appearing at certain points in the circuits of FIGS. 1 and 3.
Figure 5:
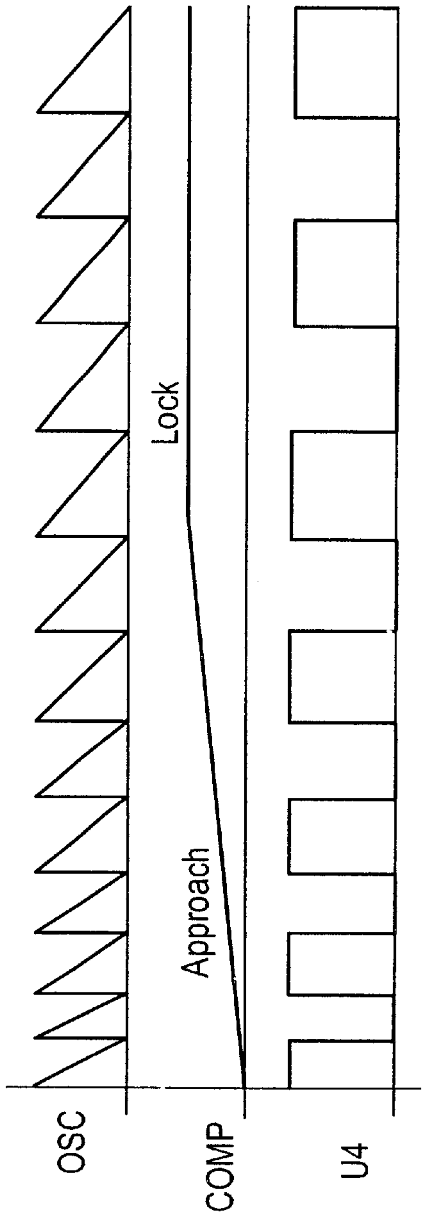

The operation of the circuit shown in FIGS. 1 and 3 is described with further reference to FIGS. 4 and 5.

FIG. 4 illustrates the general operation of the oscillator circuitry. The signal OSC is a sawtooth waveform having a fast rise time and substantially slower fall or decay time. When the Q output of latch U3 is a logic high, the transistor Q1 is ON and drives OSC high. When OSC reaches 1.7 volts, comparator U1 asserts the reset (R) input to latch U3, causing its Q output to become a logic low and shutting off Q1. At that point, OSC decays through the effect of the COMP signal, resistors RANGE and ROSC, and capacitor COSC (FIG. 1). FIG. 4 shows that the decay time is minimized, and therefore the oscillator frequency is at a maximum Fmax, when COMP equals zero volts. Decay time is maximized, and therefore the oscillator frequency is at a minimum Fmin, when COMP equals 3 volts. The precise range of oscillator frequencies (Fmin–Fmax) is selected in accordance with the characteristics of the piezo transformer 12, among other things. For a typical piezo transformer used in an LCD backlighting system, a range such as 120–160 KHz may be desirable. It will be appreciated that the flip-flop U4 is configured to divide this frequency by two, so that the frequency of the drive signals from the drive signal generator 16 (and therefore the operating frequency of the piezo transformer 12) is in the range of 60–80 KHz.

As generally described above with reference to FIG. 1, the feedback resistor RFB and feedback capacitor CFB form part of a feedback circuit operative to regulate the current in the CCFL 10. The error amplifier EA and related circuitry in FIG. 2 are the other major components in this feedback circuit. The switches S1–S4 are shown in their normal operating positions. Through the action of switches S1 and S3, the inputs of the error amplifier EA are connected to the FB node and to a 1.5 V reference, respectively. Switch S4 connects the output of the error amplifier EA to the COMP node. In this configuration, the error amplifier EA and components RFB and CFB form an integrating amplifier that integrates the current sense voltage appearing at the junction of resistors RCS and RFB (FIG. 1). When the sensed current is above a desired value represented by the 1.5 V reference voltage, the signal COMP falls, and when the sensed current is below the desired value, COMP rises. Changes in the signal COMP affect the decay time of the signal OSC, resulting in corresponding changes in the oscillator operating frequency and affecting lamp current by changing the gain of the piezo transformer 12. Thus, the signal COMP functions as an oscillator control signal in the illustrated embodiment.

The switches S1–S4 are used to establish desired initial conditions in the circuit to ensure that correct operation follows. As mentioned above, the operating frequency is generally started at its maximum value Fmax and reduced until the CCFL 10 strikes. To start the operating frequency at its maximum value Fmax, the switches S1 and S2 are closed, and S3 and S4 are opened, by action of an initialization signal INIT. Additionally, the signal COMP is pulled down to zero volts by action of the transistor Q2. The voltages at the inputs of the error amplifier EA cause its output to be driven into saturation at near zero volts. When the INIT signal is de-asserted, the integrating action of the error amplifier EA and feedback components CFB and RFB causes the signal COMP to gradually rise (shown as "approach" in FIG. 5) and the oscillator frequency to be swept lower. The circuit stabilizes (shown as "lock" in FIG. 5) when the lamp current reaches the desired value.

The switches S1–S4 and transistor Q2 constitute a small addition to the error amplifier EA and feedback circuitry that effects the correct initialization of the oscillator frequency. Prior controller circuits have required entirely separate circuitry and integrated circuit package pins for the same initialization function, and thus have suffered higher costs. The disclosed technique advantageously exploits the normal operating function of the error amplifier and feedback circuitry to perform the initialization function at little additional cost.

Figure 6:
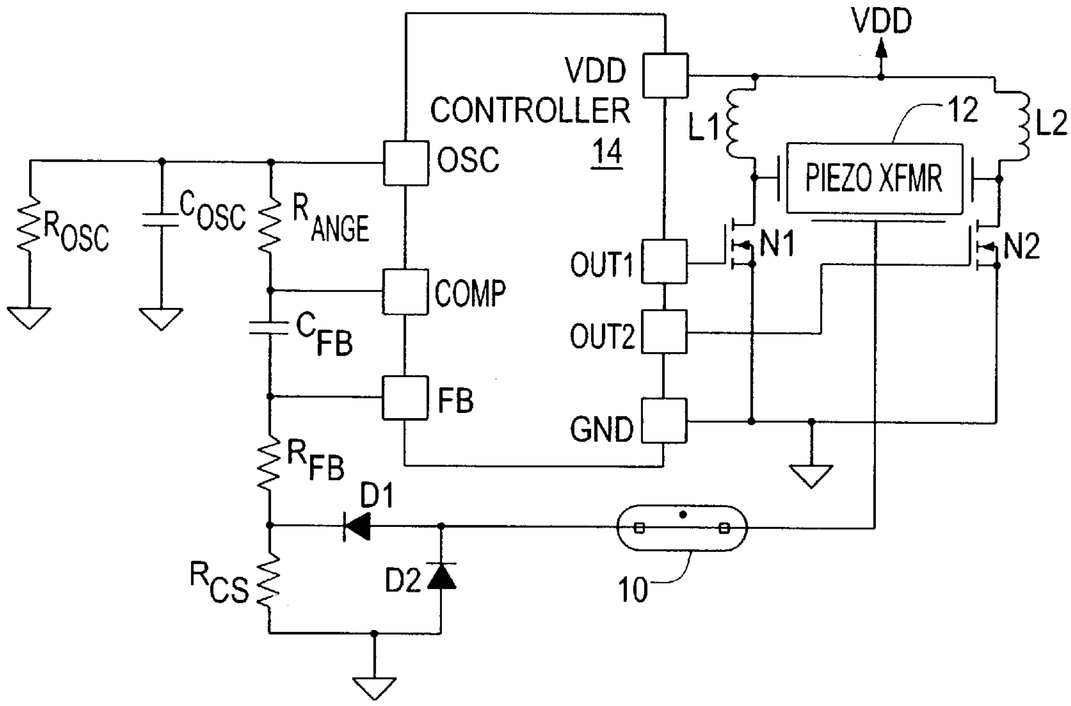
FIGS. 6–8 are schematic diagrams of alternative cold cathode fluorescent lamp power supplies according to the present invention.
Figure 7:
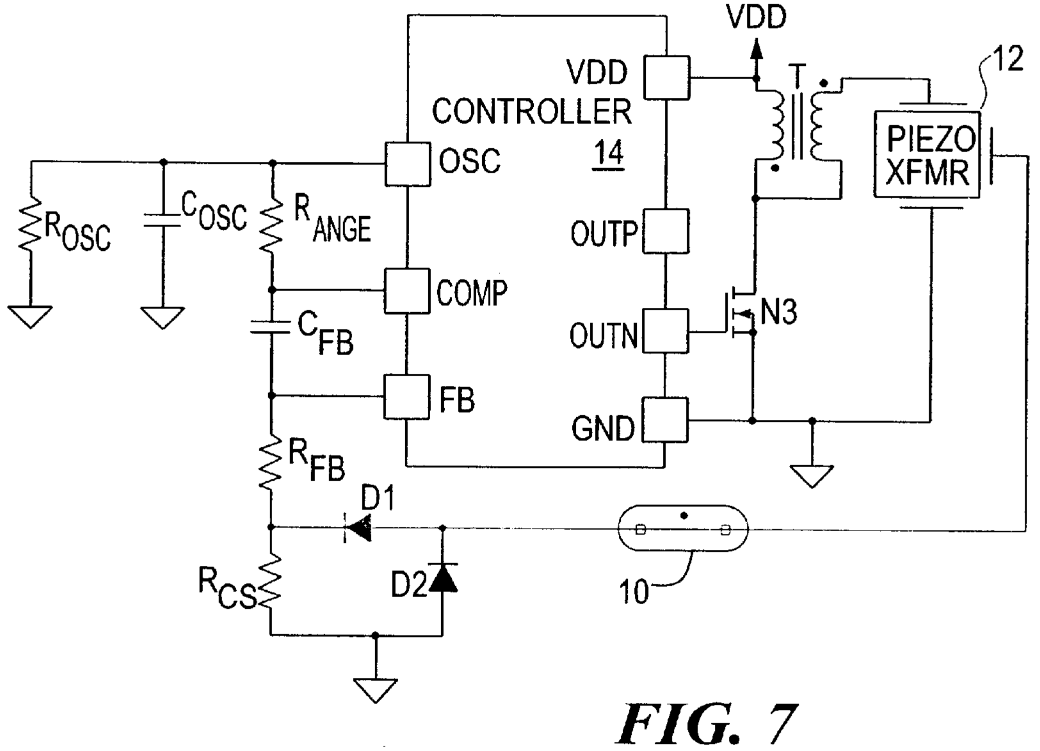
Figure 8:
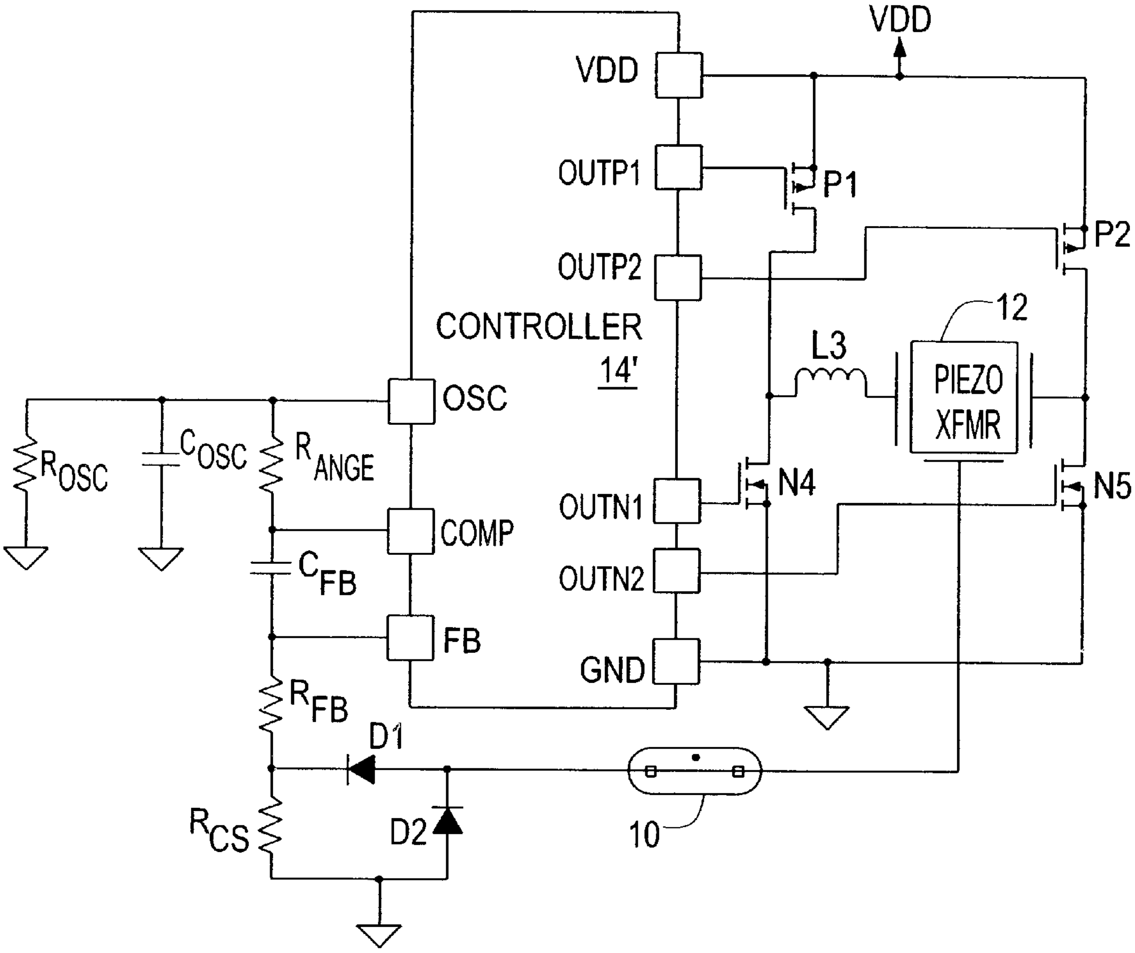

FIGS. 6–8 show CCFL power supply circuits having different topologies while employing a similar controller 14 or 14', including the error amplifier EA and initialization components S1–S4 and Q2. The supply of FIG. 6 uses a push-pull configuration including two NMOS transistors N1 and N2 and a pair of inductors L1 and L2. The supply of FIG. 7 has a flyback configuration including a single NMOS transistor N3 and a standard coil-type transformer T. The supply of FIG. 8 uses a full-bridge topology with PMOS transistors P1 and P2 and NMOS transistors N4 and N5, and a modified controller 14' that generates four output signals OUTP1, OUTP2, OUTN1 and OUTN2. In all these circuits, lamp current is regulated through feedback control of the operating frequency of the piezo transformer 12, as in the circuit of FIG. 1.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A control circuit for a piezo transformer based power supply, comprising:

oscillator circuitry operative to establish an operating frequency as a function of an oscillator control signal;

drive circuitry operative to generate a switching control signal at the operating frequency for a primary circuit of the piezo transformer;

sense circuitry operative to generate a feedback signal indicative of an operational parameter of the power supply, the operational parameter being sensitive to frequency-dependent gain of the piezo transformer; and feedback circuitry operative in response to the feedback signal to vary the oscillator control signal in a manner tending to regulate the operational parameter to a predetermined value, the feedback circuitry including initialization circuitry operative (i) during an initialization phase, to establish an initial value of the oscillator control signal corresponding to an initial operating frequency, and (ii) thereafter to permit the feedback circuitry to gradually drive the oscillator control signal to a normal operating value, such that the operating frequency is swept from the initial operating frequency to a normal operating frequency.

2. The control circuit according to claim 1, wherein the switching control signal is a first switching control signal, and wherein the drive circuitry is further operative to generate a second switching control signal at the operating frequency for the primary circuit of the piezo transformer, the second switching control signal being substantially the complement of the first switching control signal.

3. The control circuit according to claim 1, wherein the feedback circuitry comprises an error amplifier, and wherein the initialization circuitry comprises switching circuitry operative (1) during the initialization phase, to place predetermined voltages on the inputs of the error amplifier and the oscillator control signal, and (2) thereafter, to couple the feedback signal to one input of the error amplifier and couple the output of the error amplifier to the oscillator control signal.

4. The control circuit according to claim 3, wherein the switching circuitry comprises:

a first two-position switch operative in one position to couple the feedback signal to the one input of the error amplifier and operative in the other position to couple a first predetermined voltage to the one input of the error amplifier;

a pair of second two-position switches co-operative in one position to couple a second predetermined voltage to the other input of the error amplifier and co-operative in the other position to couple a third predetermined voltage to the other input of the error amplifier; and a pair of third two-position switches co-operative in one position to couple the output of the error amplifier to the oscillator control signal and co-operative in the other position to establish a fourth predetermined voltage on the oscillator control signal.

5. The control circuit according to claim 1, wherein (i) the power supply supplies power to a cold cathode fluorescent lamp, (ii) the operational parameter of which the feedback signal is indicative is the current supplied to the lamp by the power supply, and (iii) the initial operating frequency is a maximum operating frequency from which the operating frequency is swept downward to the normal operating frequency.

6. The control circuit according to claim 5, wherein the sense circuitry by which the feedback signal is generated comprises:

rectification circuitry operative to steer lamp current of a predetermined polarity to a first circuit node; and a sense resistor coupled to the first circuit node.

7. The control circuit according to claim 1, wherein the oscillator circuitry comprises:

a binary state device;

timing components operative to establish a decay rate of a voltage of a circuit node;

comparator circuitry operative to determine whether the voltage of the circuit node is above an upper limit voltage or below a lower limit voltage, the comparator circuitry being further operative (1) to toggle the state device from a first state to a second state when the voltage of the circuit node rises above the upper limit voltage, and (2) to toggle the state device from the second state to the first state when the voltage of the circuit node falls below the lower limit voltage; and a switching element operative to quickly establish one of the limit voltages on the circuit node when the state device is in one state and to permit the circuit node to gradually transition to the other of the limit voltages at the decay rate when the state device is in the other state.

8. The control circuit according to claim 7, wherein the one limit voltage quickly established by the switching element is the upper limit voltage, and the other limit voltage to which the circuit node is permitted to gradually transition by the switching element is the lower limit voltage.

9. The control circuit according to claim 7, wherein the timing components comprise a capacitor and a resistor coupled to the circuit node.

10. The control circuit according to claim 7, wherein the comparator circuitry comprises first and second comparators, the first comparator being operative to compare the voltage of the circuit node to the upper limit voltage, and the second comparator being operative to compare the voltage of the circuit node to the lower limit voltage.

11. The control circuit according to claim 7, wherein the binary state device is a latch.

12. A lighting system, comprising:

a cold cathode fluorescent lamp;

a piezo transformer having a secondary side connection to the lamp;

a switched resonant circuit connected to a primary side of the piezo transformer, the switched resonant circuit being operative to generate an AC voltage on the primary of the piezo transformer from a DC voltage under the control of one or more switching control signals;

oscillator circuitry operative to establish an operating frequency as a function of an oscillator control signal;

drive circuitry operative to generate the switching control signals at the operating frequency;

sense circuitry operative to generate a feedback signal indicative of the current in the lamp, the lamp current being sensitive to frequency-dependent gain of the piezo transformer; and feedback circuitry operative in response to the feedback signal to vary the oscillator control signal in a manner tending to regulate the lamp current to a predetermined value, the feedback circuitry including initialization circuitry operative (i) during an initialization phase, to establish an initial value of the oscillator control signal corresponding to a maximum operating frequency, and (ii) thereafter to permit the feedback circuitry to gradually drive the oscillator control signal to a normal operating value such that the operating frequency is swept from the maximum operating frequency to a normal operating frequency.

13. The lighting system according to claim 12, wherein the switched resonant circuit comprises an inductor and two switching transistors, the switching transistors being arranged in series between the DC voltage and ground, one terminal of the inductor being connected to a circuit node between the switching transistors, and the other terminal of the inductor being connected to a primary connection of the piezo transformer.

14. The lighting system according to claim 12, wherein the switched resonant circuit comprises two inductors and two switching transistors, each inductor being arranged in series with a corresponding one of the switching transistors between the DC voltage and ground, one primary connection of the piezo transformer being connected to a circuit node between one inductor and the corresponding switching transistor, and the other primary connection of the piezo transformer being connected to a circuit node between the other inductor and the corresponding switching transistor.

15. The lighting system according to claim 12, wherein the switched resonant circuit comprises a switching transistor and a transformer, the switching transistor being arranged in series with a primary winding of the transformer between the DC voltage and ground, one terminal of the secondary winding of the transformer being connected to a circuit node between the switching transistor and the primary winding of the transformer, and the other terminal of the secondary winding of the transformer being connected to a primary connection of the piezo transformer.

16. The lighting system according to claim 12, wherein the switched resonant circuit comprises four switching transistors and an inductor, a first pair of the switching transistors being arranged in series between the DC voltage and ground, and a second pair of the switching transistors being arranged in series between the DC voltage and ground, one terminal of the inductor being connected to a circuit node between the first pair of switching transistors, the other terminal of the inductor being connected to a first primary connection of the piezo transformer, and the second primary connection of the piezo transformer being connected to a circuit node between the second pair of switching transistors.

17. The lighting system according to claim 12, wherein the feedback circuitry comprises an error amplifier, and wherein the initialization circuitry comprises switching circuitry operative (1) during the initialization phase, to place predetermined voltages on the inputs of the error amplifier and the oscillator control signal, and (2) thereafter, to couple the feedback signal to one input of the error amplifier and couple the output of the error amplifier to the oscillator control signal.

18. The lighting system according to claim 12, wherein the sense circuitry by which the feedback signal is generated comprises:

rectification circuitry operative to steer lamp current of a predetermined polarity to a first circuit node; and a sense resistor coupled to the first circuit node.

19. The lighting system according to claim 12, wherein the oscillator circuitry comprises:

a binary state device;

timing components operative to establish a decay rate of a voltage of a circuit node;

comparator circuitry operative to determine whether the voltage of the circuit node is above an upper limit voltage or below a lower limit voltage, the comparator circuitry being further operative (1) to toggle the state device from a first state to a second state when the voltage of the circuit node rises above the upper limit voltage, and (1) to toggle the state device from the second state to the first state when the voltage of the circuit node falls below the lower limit voltage; and a switching element operative to quickly establish one of the limit voltages on the circuit node when the state device is in one state and to permit the circuit node to gradually transition to the other of the limit voltages at the decay rate when the state device is in the other state.

20. The lighting system according to claim 19, wherein the one limit voltage quickly established by the switching element is the upper limit voltage, and the other limit voltage to which the circuit node is permitted to gradually transition by the switching element is the lower limit voltage.

* * * * *